(12) United States Patent
Heavlin (10) Patent No.: US 6,389,366 B1
(45) Date of Patent: May 14, 2002

(54) METHODS FOR IDENTIFYING SOURCES OF PATTERNS IN PROCESSING EFFECTS IN MANUFACTURING

(75) Inventor: William D. Heavlin, El Granada, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/276,422

(22) Filed: Mar. 25, 1999

(51) Int. Cl.[7] .......................... G06F 19/00; G01L 21/66
(52) U.S. Cl. ............................. 702/84; 702/81; 438/21; 700/117
(58) Field of Search ........................... 702/84, 81, 151, 702/163, 182; 700/95–97, 109–110, 115–117, 121, 133; 382/226, 228; 438/14, 21

(56) References Cited

U.S. PATENT DOCUMENTS

| | | | |
|---|---|---|---|
| 5,226,118 A | * 7/1993 | Baker et al. ................. | 345/833 |
| 5,450,326 A | * 9/1995 | Black ......................... | 700/121 |
| 5,716,856 A | 2/1998 | Lin et al. ..................... | 438/14 |
| 5,761,065 A | 6/1998 | Kittler et al. ............... | 700/117 |

OTHER PUBLICATIONS

Scher, et al., "In–line Statistical Process Control And Feedback For VLSI Integrated Circuit Manufacturing", IEEE Transactions On Components, Hybrids, And Manufacturing Technology, vol. 13, No. 3, pp. 89–94 (Sep. 1990).

Scher, "Wafer Tracking Comes Of Age", Wafer Sleuth Implementation Guide SEMATECH Confidential, Technology Transfer #91060587A–ENG, Appendix B—Examples of Problem Solving at Hewlett–Packard, pp. 96–101 (May 1991).

* cited by examiner

*Primary Examiner*—Bryan Bui
(74) *Attorney, Agent, or Firm*—Skjerven Morrill MacPherson LLP; Edward C. Kwok (57) ABSTRACT

Identification of within-wafer and wafer-to-wafer variations in yield induced by processing steps in a multi-step manufacturing process. Methods are implemented along with wafer position tracking for process control of the manufacturing process. Wafers are systematically rotated according to their position in a batch before entering a processing step. Wafer position tracking analysis of rotated wafers advantageously reveals a static pattern on each wafer regardless of position in a batch. Alternatively, data reduction methods provide a compact representation of site-specific yield data. The data reduction methods use multidimensional scaling to determine distance factor scores and angle factor scores. The distance factor scores track changes in pattern on the wafers. Wafers similar in pattern regardless of rotation angle have similar distance factor scores. The angle factor scores track rotation of patterns on wafers. Analysis of scatter plots enables a process operator to determine which processing step is responsible for variations in yield.

16 Claims, 6 Drawing Sheets

METHODS FOR IDENTIFYING SOURCES OF PATTERNS IN PROCESSING EFFECTS IN MANUFACTURING

TECHNICAL FIELD

This invention relates generally to process control methods for use in manufacturing and, in particular, to process control methods that efficiently identify sources of patterns resulting from processing effects.

BACKGROUND

Many products and in particular semiconductor devices require multiple discrete processing steps to manufacture the products. For example, several hundreds of steps may be required to produce an integrated circuit from raw semiconductor material. The starting substrate is usually a slice of single crystal silicon referred to as a wafer. Multiple circuits, as many as several hundred, are fabricated on a single wafer and singulated later. Wafers may go through processing steps one at a time or, maybe processed together in batches called "lots" or "runs."

Data gathered during the course of wafer processing is used to diagnose yield problems and forms the basis of yield improvement efforts. Such data includes parametric electrical test data gathered on individual circuits and test structures fabricated on the wafers, as well as final yield test data which tests the suitability for use once wafer processing is completed.

It has been recognized that one of the sources of yield variation is the order in which wafers in a lot are processed at a given processing step or the physical location of the wafer in batch processing equipment. The practice of tracking wafer processing order at critical processing steps and correlating this processing order to device performance in order to improve yields has become known as "Wafer Position Tracking." The benefits of this practice are described, for example, in the paper by Scher et al., IEEE Transactions of Components, Hybrids, and Manufacturing Technology, Vol. 13, No. 3, pp 484–489 (1990).

In wafer position tracking, typically, a scribed identifying code on each wafer is read and recorded by specialized equipment. In many implementations, the wafers are placed in random order before critical processing steps to ensure effects from different steps are not compounded and the order of the wafers is recorded before and after randomization. When final yield data or other test data is plotted as a function of wafer order at critical processing steps, the signature of the piece of processing equipment responsible for any wafer-to-wafer variations in output often can readily be identified, facilitating corrective action by process engineers.

Figure 1:
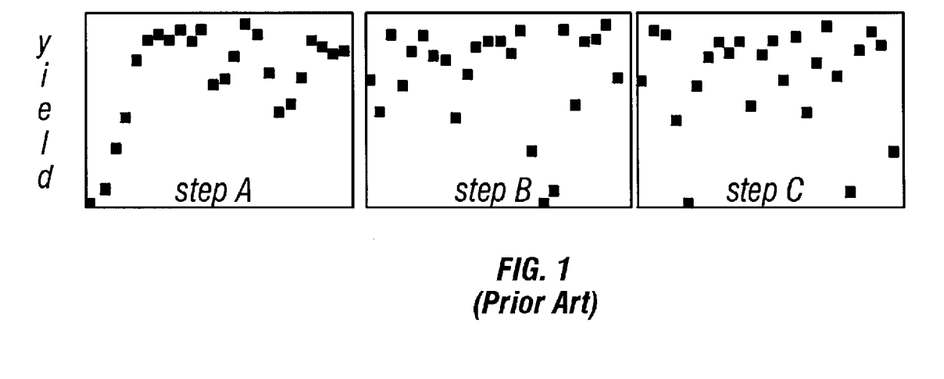
FIG. 1 shows three wafer position tracking scatter plots of the prior art.

An example of wafer position tracking plots, referred to as scatter plots, is shown in FIG. 1 for three processing steps. In this example, the monotonic increase in yield with wafer sequence number in the plot for step A indicates a "warm-up" effect in step A, while no positional dependence is observed in the wafer sequence of steps B and C. Statistical methods, such as correlation statistics, run statistics, and control charts, can be used to screen the scatter plots for systematic dependence on wafer sequence. Specific implementations of wafer position tracking are described, for example, in U.S. Pat. No. 5,716, 856 to Lin et al. and U.S. Pat. No. 5,761,065 to Kittler et al., both commonly assigned with the present application and incorporated herein by reference.

As described above, wafer position tracking typically uses summary statistics of whole wafers to track wafer-to-wafer variation in yield where yield may be considered the percentage of individual dies on a wafer that pass a final quality control test. Wafer position tracking is less sensitive to wafer-to-wafer variations affecting only part of a wafer. In addition, some processing problems, instead of introducing wafer-to-wafer variation, may introduce patterns of yield variations as a function of physical position on a single wafer. Wafer position tracking will not reveal a yield variation that appears as the same pattern on each wafer.

Figure 2:
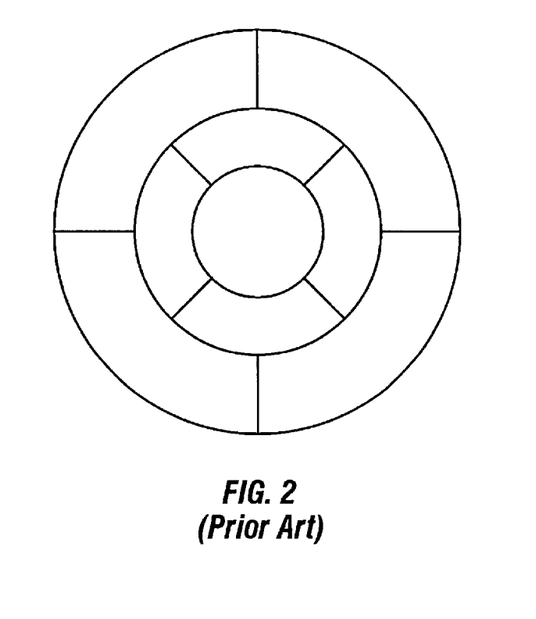
FIG. 2 is a sector map used in sector wafer position tracking in the prior art.

To address variation within a single wafer, a sector version of wafer position tracking has been introduced. In sector tracking, the wafer surface is divided into sectors, for example, into the pattern of nine sectors illustrated in FIG. 2. Then wafer position tracking is performed for each sector individually. However, sector wafer position tracking may not be an optimal process control solution. The division into sectors is arbitrary and may not reveal a problem yield pattern in any particular lot. Performing sector position tracking multiplies the amount of work performed in process control by the number of sectors, in this example by about an order of magnitude.

Furthermore, massive amounts of data are potentially available for process control. After processing is completed, multiple properties of individual circuits on each wafer can now be measured and recorded routinely. In some cases, data for individual circuits is recorded at intermediate processing steps, as well. Typical numbers of circuits per wafer are several hundreds of circuits aid typical batch sizes are between 12 and 50 wafers per batch, with 24 wafers per batch quite common.

What is needed is a method to recognize both wafer-to-wafer and within-wafer variations in output induced by processing effects. What is needed is a method of data reduction to take advantage of the massive amounts of data collected during wafer fabrication for process control of both wafer-to-wafer and within-wafer variations in yield.

SUMMARY

Methods are provided to identify within-wafer and wafer-to-wafer yield variations resulting from processing steps in a multi-step manufacturing process. The methods are implemented along with wafer position tracking for controlling the manufacturing process.

According to an embodiment of the present invention, wafer position tracking with rotation reveals a static pattern in yield data, or other site-specific processing data, present on each wafer independent of position in a batch. In wafer position tracking with rotation, after wafers are ordered and the order recorded, as in previous implementations of wafer position tracking, the wafers are systematically rotated according to their position in the batch before entering a processing step. When a visual representation of yield data for each wafer is displayed in the wafer sequence order of the processing step which is responsible for introducing the static pattern, the pattern will appear in a successively rotated position on successive wafers. A process operator can, thus, readily identify the process step responsible for introducing the static pattern and take corrective action.

According to another aspect of the present invention, data reduction methods are provided to provide a compact representation of site-specific data. For each wafer, measurements on a discrete grid of locations, such as the location of each circuit on a wafer are transformed into a continuous function, termed a wafer function. A distance matrix and an angular rotation matrix are calculated from the wafer functions. Each element of the rotation matrix gives the rotation angle by which one wafer would be rotated to have a pattern as similar as possible to the other wafer. Each element of the distance matrix is a measure of the difference between the patterns on the two wafers when one or both wafers are rotated to realize this most similar pattern.

From the distance and angular rotation matrices, multi-dimensional scaling methods are applied to determine distance factor scores and angle factor scores. The distance factor scores and angle factor scores are the coordinates of vectors of very low dimension and thus provide a compact representation of the site-specific data at many grid points. The distance factor scores track changes in pattern on the wafers. Wafers similar in pattern after rotation have similar distance factor scores. The angle factor scores track rotation of patterns on wafers. Wafers that have patterns that are similar with little or no rotation have angle factor scores that are close to each other. The angle factor scores are preferably used to reveal patterns in data obtained with systematic rotation as described above for wafer position tracking with rotation. The distance factor scores and angle factor scores are used to create wafer position tracking scatter plots in place of, for example, total yield.

The rotation reflection method of data reduction is another embodiment of the present invention. According to the rotation reflection method, for each wafer, in addition to the wafer function described above, a second wafer function, related to the first by reflection in the plane of the wafer, is determined. Distance and angular rotation matrices are determined from an enlarged set of wafer functions including reflected wafer functions. When the rotation reflection method is used, wafers that are similar in pattern, regardless of reflection and of rotation angle have distance factor scores that are similar.

In another embodiment of the present invention, a method of using the data reduction method for process control in manufacturing is provided. According to the process control method, site-specific data is obtained for individual processing steps and the data reduction method described above is applied to obtain distance factor scores and angle factor scores. The distance factor scores and angle factor scores are used as variables in wafer position tracking scatter plots which display the scores as a function of wafer sequence at different processing steps. The scatter plots are screened by known methods to identify the plots indicative of non-random variations in result. The identified plots are analyzed by an operator to determine which processing step is responsible for within-wafer or wafer-to-wafer variations. The operator can then take engineering action to improve the manufacturing process.

In yet another method of using site-specific data for process control, a similarity index identified with a process step is computed from the distance matrix and a second wafer-to-wafer distance matrix that reflects the difference in sequence number for wafers at that process step. The similarity index is compared to a distribution of similarity indices for wafers in a random process sequence to identify process step effects.

DETAILED DESCRIPTION

The present invention will be described in the context of manufacturing semiconductor devices. This is exemplary only, as the method of the invention is applicable to manufacturing other products produced by multiple processing steps.

Figure 3:
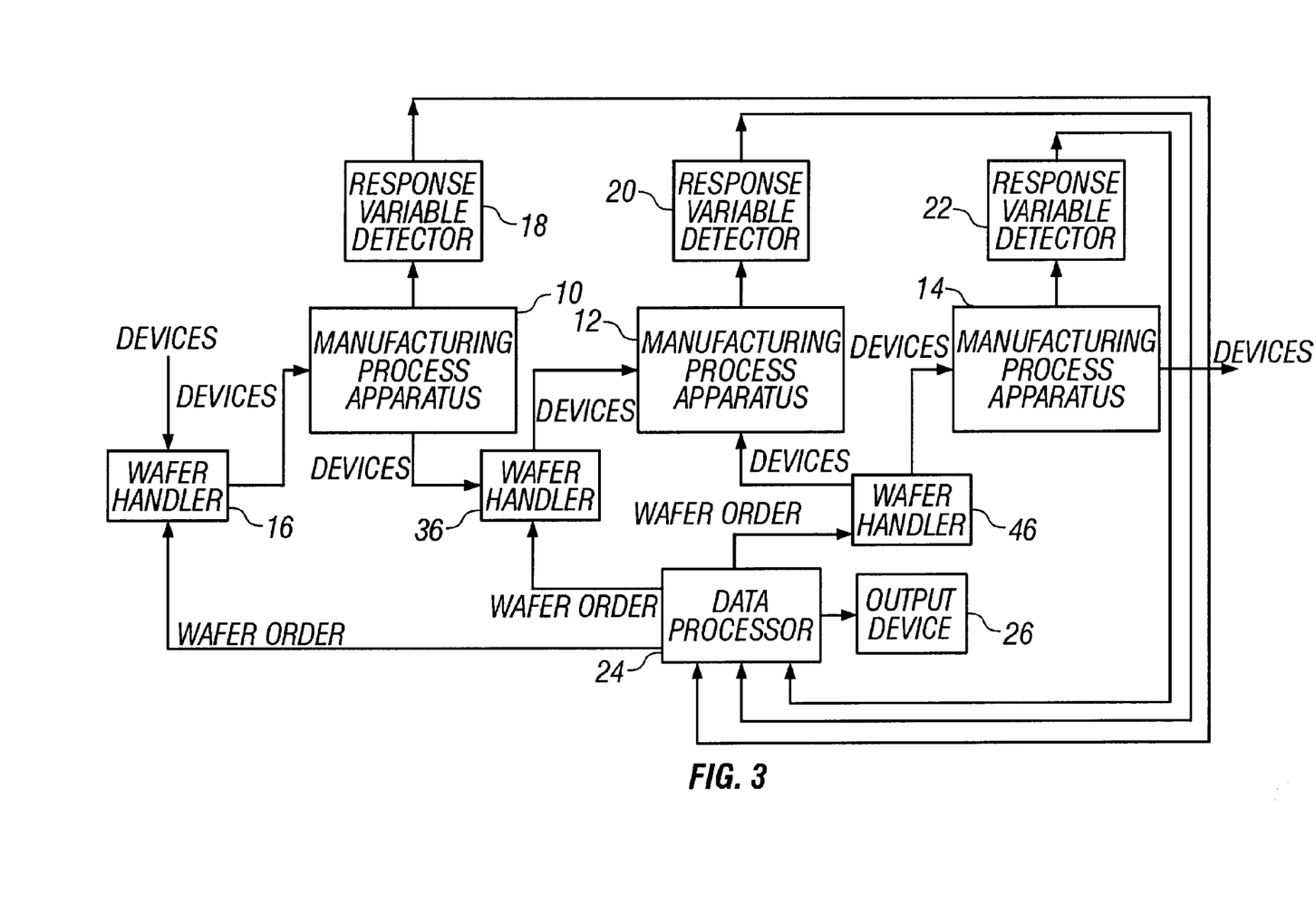
FIG. 3 is a block diagram of a manufacturing process arrangement in which methods according to the present invention are implemented.

FIG. 3 is a block diagram depicting a semiconductor device processing arrangement and an arrangement for analyzing the process, in which the wafers can be re-ordered and manipulated between processing steps. The semiconductor wafers are processed, in a sequence indicated by the arrows, by manufacturing process apparatuses 10–14. A first manufacturing process apparatus 10 performs one or more manufacturing process steps on wafers in a known sequence. The wafers are sequenced and placed by a wafer handler 16, such as a conventional scribe reader that reads the scribed wafer identification information.

After processing by the manufacturing process apparatus 10, the wafers undergo processing by manufacturing process apparatus 12. The sequence and placement of the wafers for process apparatus 12 is controlled by another wafer handler 36. Wafer handler 36 changes the sequence of the wafers from that provided by wafer handler 16. The changing of the processing sequence between processing steps prevents confounding of any processing sequence effects. A third manufacturing apparatus 14 further processes the wafers under control by wafer handler 46.

To perform process analysis, response variable detector 22 is provided after the final manufacturing process apparatus 14 to detect at least one response variable of the manufactured product. For example, the response variable may be the threshold voltage of the integrated circuit on each die of the wafer. Intermediate response variable detectors 18 and 20 may also be provided to detect features characteristic of intermediate stages of the fabrication process. The response variable detectors 18–22 may detect the same or different variables, depending on the manufacturing process.

The data detected by response variable detectors 18–22 is collected by a data processor 24. The results of analysis of this data are output to output device 26, which is, for example, a printer or a video display.

In wafer position tracking as conventionally practiced, wafer handler 36 randomizes the sequence of the wafers and records the new sequence before the wafers enter manufacturing process apparatus 12. Similarly, wafer handler 46 again randomizes the wafer sequence and keeps a record of the wafer ordering. In the wafer position tracking implementation disclosed in U.S. Pat. No. 5,716,856, instead of randomly re-ordering the wafer, wafer handlers 16, 36, and 46 order the wafers according to a predetermined order for each step, stored in a data table.

Figure 4:
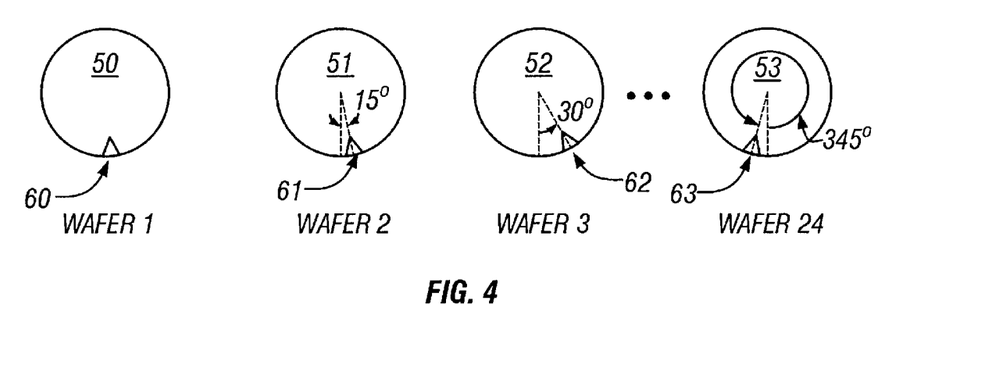
FIG. 4 illustrates systematic rotation of wafers for the process of wafer position tracking with rotation according to an embodiment of the present invention.

According to embodiments of the present invention, the orientation of individual wafer in the batch processing apparatus is controlled in addition to the wafer sequence. At certain wafer sequencing steps, after determining the wafer sequence by any method, wafer handlers, such as wafer handlers 16, 36, and 46 systematically rotate each wafer by a number of degrees that depends on the placement of the wafer in the batch. For example, for a batch of 24 wafers, illustrated in FIG. 4, the first wafer 50 is not rotated, the second wafer 51 is rotated by 15°, the third wafer 52 by 30°, and the last wafer 53 by 345°. In general, for a batch containing n wafers, the $i^{th}$ wafer is rotated by $((i-1)/n) \times 360°$. Each wafer has a mark on the outer edge at one location that defines the origin with respect to which rotation is determined. In FIG. 4 notches 60–63 define the origins of wafers 50–53, respectively.

Figure 5A:
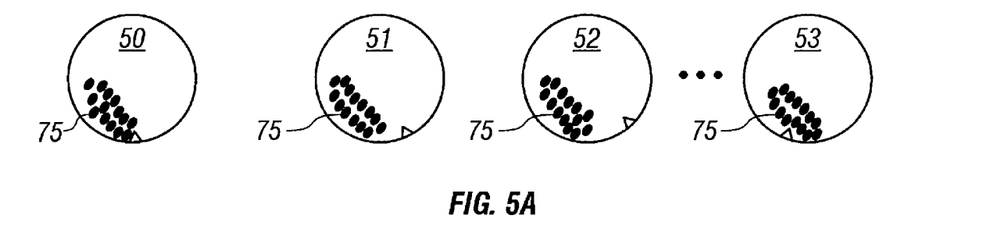
FIG. 5(a) illustrates the case of the same pattern imprinted on each wafer, where the wafers have been systematically rotated according to FIG. 4.

Wafer position tracking with rotation advantageously reveals a static pattern present on each wafer independent of position in the batch. For example, response variable detector 22 measures a threshold voltage for each circuit on the wafer and records it as a function of the site on the wafer. FIG. 5(a) illustrates one visual representation of such data where nothing is plotted at the position of a circuit whose measured voltage was within quality control acceptance limits, (Yield=1) and a large dot is plotted if the circuit "fails" the acceptance test (Yield=0). A yield pattern 75 of sites with Yield=0 can be seen on wafer 50 in FIG. 5(a).

Figure 5B:
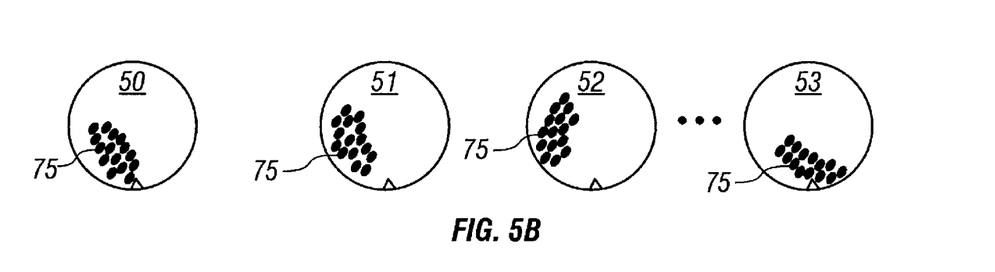
FIG. 5(b) illustrates the wafers of FIG. 5(a) displayed in a standard (unrotated) orientation.

If manufacturing process apparatus 12 is responsible for producing pattern 75 on each wafer and each wafer is oriented as shown in FIG. 4 going into apparatus 12, each wafer would exhibit yield pattern 75 in the same position, as shown in FIG. 5(a). FIG. 5(b) illustrates the yield data representation for wafers in the standard (unrotated) orientation, ordered according to the order of the wafers in apparatus 12. In FIG. 5(b), on each wafer, pattern 75 is recognized as rotated by the same amount by which the wafer was rotated, but in the opposite direction. Thus, to determine which processing apparatus was responsible for producing a pattern, yield data representations are displayed in the sequence corresponding to the wafer sequence for each manufacturing process apparatus. The sequence in which the pattern appears successively rotated as in FIG. 5(b) corresponds to the responsible processing apparatus.

Figure 6:
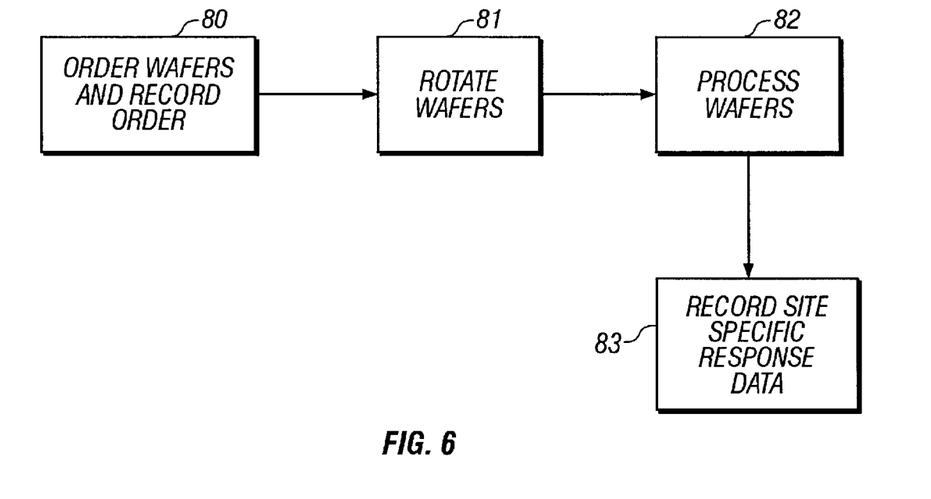
FIG. 6 is a flow chart of the process performed at a single manufacturing apparatus according to embodiments of the present invention.

The process performed at a single manufacturing process apparatus of FIG. 3 for implementing wafer position tracking with rotation is indicated schematically in the flow chart in FIG. 6. At step 80, the wafers are ordered and the order is recorded and transmitted to data processor 24. Then at step 81, the wafers are rotated systematically before entering the manufacturing process apparatus at step 82. If processing step 82 is the last processing step, then at step 83 site-specific response data is typically recorded for each wafer. If processing step 82 is an intermediate processing step, recording of site-specific response data at step 83 is optional; however, step 83 must be performed for at least one processing step.

Figure 7:
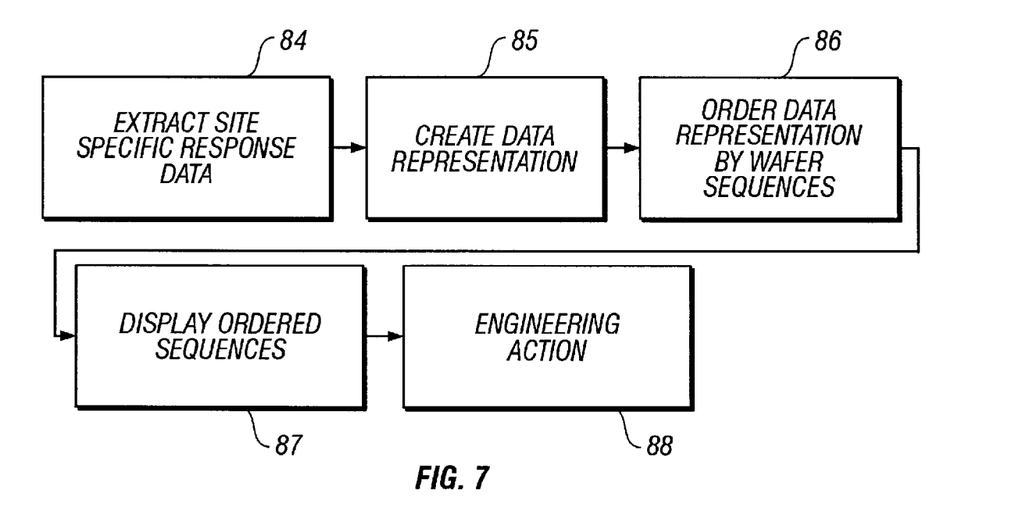
FIG. 7 is a flow chart of the process of wafer position tracking with rotation according to embodiments of the present invention.

The method of analyzing the data obtained from steps 80–83 in FIG. 6 and using it for process control is illustrated in the flow chart of FIG. 7. In a first step 84, the site-specific response variable data from the detectors 18–22, obtained at step 83, is extracted by the data processor 24. At step 85, the data processor 24 transforms the data for each wafer into a representation for display, such as the binary yield data representation shown in FIGS. 5(a) and 5(b), and at step 85 processor 24 orders the data representation by the wafer sequences stored at step 80. The ordered representations are displayed on the output device 26 at step 87. For the manufacturing process of FIG. 3, the same set of data representations will be displayed three times, according to the wafer sequences of apparatus 10, 12, and 14. From the display at step 87, a process operator can easily determine which process is responsible for within-wafer variations and take engineering action at step 88.

According to a second embodiment of the present invention, a data reduction method is provided to transform site-specific response variable data, recorded together with wafer sequence and, optionally, with systematic wafer rotation, into a compact form useful for wafer position tracking. Analysis of site-specific data using the present methods reveals both wafer-to-wafer and within-wafer variations. In particular, the data reduction methods are useful for identifying within-wafer patterns that are similar except for angular rotations and mirror image reflections. First, a derivation of the data reduction method is presented and then its application to process control of a manufacturing process is described.

In the data reduction method, first, site-specific response variable data is represented as a continuous function $f_w(x,y)$ over a continuous domain $(x,y)$ on wafer w. The functions $f_w(x,y)$, termed wafer functions, are the type of representation conventionally used to draw contour maps. Examples of site-specific response variable data include continuous measurements on a grid of discrete locations, such as threshold voltage measurements of each circuit on the wafer where each $(x,y)$ is a circuit position. Such data can be represented by the method known in statistics as kriging, described, for example in Ripley, "Stochastic Process Prediction" Chapter 4.4 (Wiley, N.Y., 1981). Alternatively, the response data could be discrete values on a grid as in Yield of 0 or 1 for each circuit. These discrete (digital) data can be converted to a continuous function by standard methods known in the art. These methods are described, for example, in a paper by Besag, J. Royal Statistical Soc. B, Vol. 36, pp 192–225 (1974). Other types of site-specific data, such as the locations of particles on a wafer, which are discrete observations taken at spatial coordinates that are themselves random, can be represented as continuous functions $f_w(x,y)$ by other methods known in the statistics art. (See, for example, Diggle, "Statistical Analysis of Spatial Point Patterns," (Academic Press, NY, 1983)).

The wafer functions are used to calculate a wafer-to-wafer distance matrix $d^2(w,w')$ and an angular rotation matrix $\Theta((w,w')$. The distance and angular rotation matrices are defined:

$$d^2(w, w') = \min_{\theta} \sum_{(x,y) \in G} \{\|f_w(x, y) - f_{w'}(x(\theta), y(\theta))\|^2\} \quad (1)$$

where $\Theta(w,w')$ is the minimizing rotation angle for each wafer pair w, w'. The rotated coordinates $x(\theta)$ and $y(\theta)$ $x(\theta) = x \cos\theta - y \sin\theta$ $y(\theta) = x \sin\theta + y \cos\theta$, give the values of x and y after rotation through an angle $\theta$. The summation in Formula (1) is over all discrete locations (x,y) in grid G. For n the number of wafers in a batch, the distance and angular rotation matrices are of dimension n×n.

The rotation matrix $\Theta(w,w')$ gives the rotation angle that makes the pattern for wafer w most like that for wafer w'. Each element of the distance matrix $d^2(w,w')$ can be interpreted as the square of the distance between wafer function w and wafer function w' in the space of function $f_w(x,y)$, when the wafers have been rotated to be as similar as possible. Qualitatively, each element is a measure of how different the pattern on wafer w is from the pattern on wafer w'.

A multidimensional scaling algorithm is applied to represent the wafers, in particular their distance matrix $d^2(w,w')$ and rotation matrix $\Theta(w,w')$ as points in a reduced-dimension vector space, thereby accomplishing substantial data reduction. The methods of multidimensional scaling have a substantial literature. (See, for example, Young, "Multidimensional Scaling" in "Encyclopedia of the Statistical Sciences", Vol. 5, pp 649–659 (1985) and Friedman et al., Annals of Statistics, 11, 377 (1983). The principal mathematical idea behind the method of data reduction is to approximate these matrices as the difference between vectors in a low-dimensional coordinate space to be determined. The distance matrix $d^2(w,w')$ is written in terms of a row vector $z_w$ of dimension k as $$d^2(w,w')=\|z_w-z_{w'}\|^2. \quad (2)$$

Expanding the right hand side of equation (2), arbitrarily setting $z_1=0$, i.e. setting the vector corresponding to the first vector in the lot equal zero, without loss of generality, which gives $\|z_w\|^2=d^2(w,1)$, and rearranging terms, Equation (2) becomes $$z_w z^T_{w'}=1/2(d^2(w,1)+d^2(w',1)-d^2(w,w')). \quad (3)$$

The right hand side of Equation (3) is evaluated from Equation (1) and the vectors $z_w$ are determined by eigenvalue decomposition. Using standard matrix diagonalization methods, Equation (3) can be rewritten as:

$$ZZ^T=UD_{90}U^T \quad (4)$$

where $Z=UD^{1/2}_\lambda$ is the matrix of eigenvectors and $D_\lambda$ is a diagonal matrix of eigenvalues. The rows of the Z matrix are the k-dimension row vectors $z_w$. The eigenvalues give the relative importance of each dimension. An appropriate value of k is determined by requiring $D_\lambda(k)>>D_\lambda(k+1)$. In Equation (4), the matrices Z and U are of dimension n×k, and D is of dimension k×k. A reduced dimension k of 1, 2, or 3 can provide a reasonable approximation in Equation (2).

The vectors $z_w$ provide a greatly reduced representation of the original response variable data represented in the function $f_w(x,y)$. The coordinates of $z_w$, termed distance factor scores, track changes in pattern on the wafers. Wafers similar in pattern regardless of rotation angle will have distance factor scores that are close to each other. For a case where k=2, a two-dimensional display in which wafer number w is positioned using the value of $z_w(1)$, the first z coordinate, on one axis and $z_w(2)$ on the second axis, places similarly patterned wafers close together. The distance factor scores can each be used as a response variable for wafer position tracking scatter plots in place of, for example, total yield.

Data reduction is also applied to the angular rotation matrix $\Theta(w,w')$ that minimizes the distance matrix $d^2(w,w')$. The rotation matrix is approximated by the dot product of an unknown reduced dimension vector $t_w$ where $\Theta(w,w')$ in radians is interpreted as the arc length on great circles of a unit radius sphere:

$$t_w t^T_{w'}=\cos(\Theta(w,w')). \quad (z5)$$

The angular rotation matrix on the right hand side of Equation (5) is evaluated in the course of evaluating Equation (1). The row vectors tw are initially obtained by eigenvalue decomposition of Equation (5) analogously to the solution of Equation (3) with two refinements. First, row vectors $t_w$ are projected onto a sphere of unit radius, and second, they are rotated to maximize the variance of the lower indexed dimensions, that is to represent the matrix $\Theta(w,w')$ with as low a dimensionality of $t_w$ as possible. The row vectors $t_w$, termed angle factor scores, are also used for wafer position tracking. The angle factor scores track rotation of patterns on wafers. Wafers that have patterns that are similar with little or no rotation have angle factor scores that are close to each other. The angle factor scores provide the greatest information when the wafers have been systematically rotated during processing as described above in FIG. 6.

In a further embodiment, a data reduction method termed the "rotation reflection model" enables tracking of patterns on wafers related by reflection in addition to by rotation. In the rotation reflection model, site-specific response variable data for each wafer is represented by two continuous functions, $g_w(x,y)$ and $g'_w(x,y)$, where the second is related to the first by reflection. Without loss of generality, suppose the wafer center of gravity is at x=y=0. For example, $g'_w(x,y)=g_w(x,-y)$. To equivalent effect, $g'_w(x,y)$ could be derived by a reflection in the x coordinate. In this case, a batch of n physical wafers is replaced by a batch of 2n "mathematical" wafers. The analogous data reduction method of Equations (1)–(5) is applied, where now the matrices $d^2(w,w')$ and $\Theta(w,w')$ are of dimension 2n ×2n. In Equation (1), the function $f_w(x,y)$ is interpreted as:

$$f_w(x,y) = g_w(x,y) \quad w \leq n$$
$$= g'_w(x,y) \quad n < w \leq 2n \quad (6)$$

As above, the distance factor scores track changes in pattern on the wafers. Wafers similar in pattern, regardless of reflection and of rotation angle, will have distance factor scores that are close to each other. Frequently a wafer and its own reflection will have distance factor scores that are close to each other which implies that the pattern on the wafer is symmetric with respect to some axis of reflection.

Another data reduction method uses complex numbers to perform data reduction on the distance and rotation matrices at the same time. According to this method, a complex matrix H(w,w') of dimension n×n is formed where $$H(w,w')=d^2(w,w') \, e^{i\Theta(w,w')}. \quad (7)$$

An analysis comparable to that of Equations (1)–(4) above, where the matrix complex conjugate takes the place of the matrix transpose in Equations (3) and (4), leads to a complex vector $h_w$ of reduced dimension k analogous to the vector $z_w$ derived above. Each component of $h_w$ is a complex number and constitutes both the distance factor and angle factor scores. The complex coordinates of the vector $h_w$ are used in the same manner as described above for $z_w$ and $t_w$.

Figure 8:
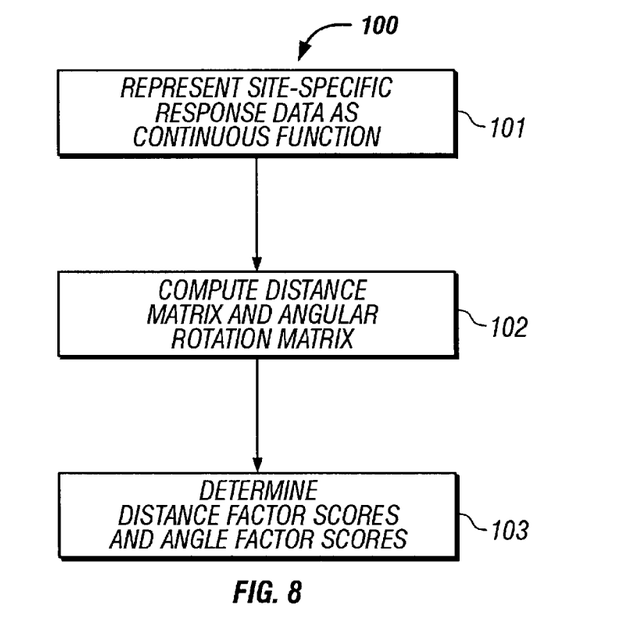
FIG. 8 is flow chart of the data reduction method according to an embodiment of the present invention.

The steps of the data reduction method 100 derived above are illustrated in the flow chart of FIG. 8. At step 101, site-specific response data is represented as continuous wafer functions. In one embodiment, the continuous wafer functions include the reflected wafer functions as described in Equation (6). At step 102, the wafer functions are used to compute the distance matrix and rotation angle matrix. At step 103, distance factor scores and angle factor scores are computed from the distance matrix and rotation angle matrix. The calculations at step 103 use the formulas of Equations (3) and (5) above. Alternatively, the calculations at step 103, use the complex number analysis of Equation (7).

Figure 9:
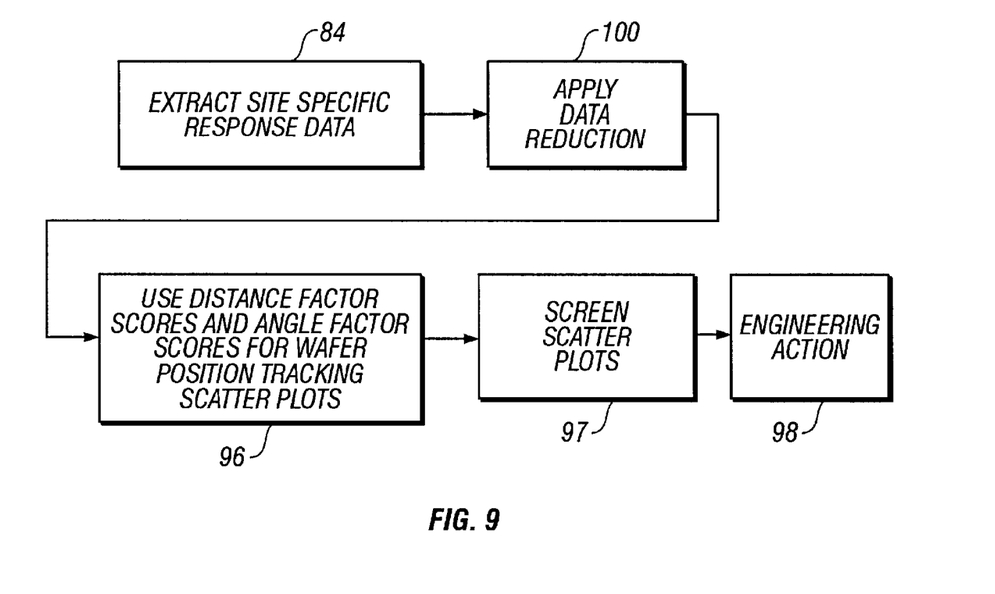
FIG. 9 is a flow chart of the method of identifying within-wafer and wafer-to-wafer variation for process control in manufacturing according to an embodiment of the present invention.

The method of identifying sources of within-wafer and wafer-to-wafer patterns for process control in manufacturing, according to embodiments of the present invention, is illustrated in the flow chart of FIG. 9. In a first step 84, site-specific response variable data is extracted by data processor 24, as described above in FIG. 7 with respect to wafer position tracking with rotation. Preferably, the data are obtained by the process of FIG. 6 in which the wafers have been systematically rotated at step 81. Alternatively, response data obtained without systematic rotation is used. Systematic rotation cannot be applied for process steps that require a fixed wafer orientation, such as lithographic masking steps. Next, the data reduction method 100, illustrated in FIG. 8 is applied by processor 24. At step 96, the distance factor scores and angle factor scores obtained at step 100 are used as response variables by processor 24 to create wafer position tracking scatter plots.

Screening methods known in the art are used to analyze the scatter plots at step 97 to determine which plots are indicative of processing step-induced variations in result. The methods include, first, visual inspection, in which scatter plots are displayed on output device 26 and examined visually by an operator to detect processing step-induced patterns. Second, the scatter plots are analyzed by calculating linear correlation coefficients. Third, control chart methods are used, and fourth other run statistics are calculated. The second, third, and fourth methods, performed in processor 24, identify a small number of scatter plots that are displayed on output device 26 and analyzed by an operator. From the analysis at step 97, a process operator can determine which processing step is responsible for within-wafer or wafer-to-wafer variations and take engineering action at step 98.

The computational effort required to perform data reduction method 100 can be reduced in several ways. The effort to compute the distance matrix and rotation angle matrix at step 102 can be reduced by using a coarser grid than the grid of circuit locations over which the site-specific response data was obtained. For example, for a wafer with yield data obtained at 306 sites, calculations on a grid of 68 sites provides a useful approximation. In the rotation reflection model, computations at step 102 can take advantage of symmetry. The element of the distance matrix connecting any pair of wafer functions is the same as the element between the corresponding reflected wafer functions. Similarly, the element of the distance matrix connecting a first wafer function and a reflected second function is the same as the element connecting the reflection of the first wafer function and the original (unreflected) second wafer function. Further generalizations may be implemented using mathematical group theory.

In yet another embodiment, an alternative analysis is applied to the distance matrix $d^2(w,w')$ of equation (1) to use site-specific data for process control. According to the alternative analysis, a rank matrix $R(w,w')$ is defined. Each element of a column of the matrix R contains the rank of the corresponding column of the matrix $d^2(w,w')$. For example, if $d^2(1,1)$ is the smallest element in the first column of the $d^2$ matrix, the corresponding element $R(1,1)=1$. At each process step, s, a wafer-to-wafer distance matrix $W_s(w,w')$ is defined. The elements of the matrix $W_s(w,w')$ are the difference in sequence number between wafer w and wafer w' at step s. A similarity index $I_s$ at step s is defined as the sum of the element-by-element product of the R matrix and the $W_s$ matrix:

$$I_s = \sum_{w,w'} R(w, w') * W_s(w, w') \quad (8)$$

Figure 10:
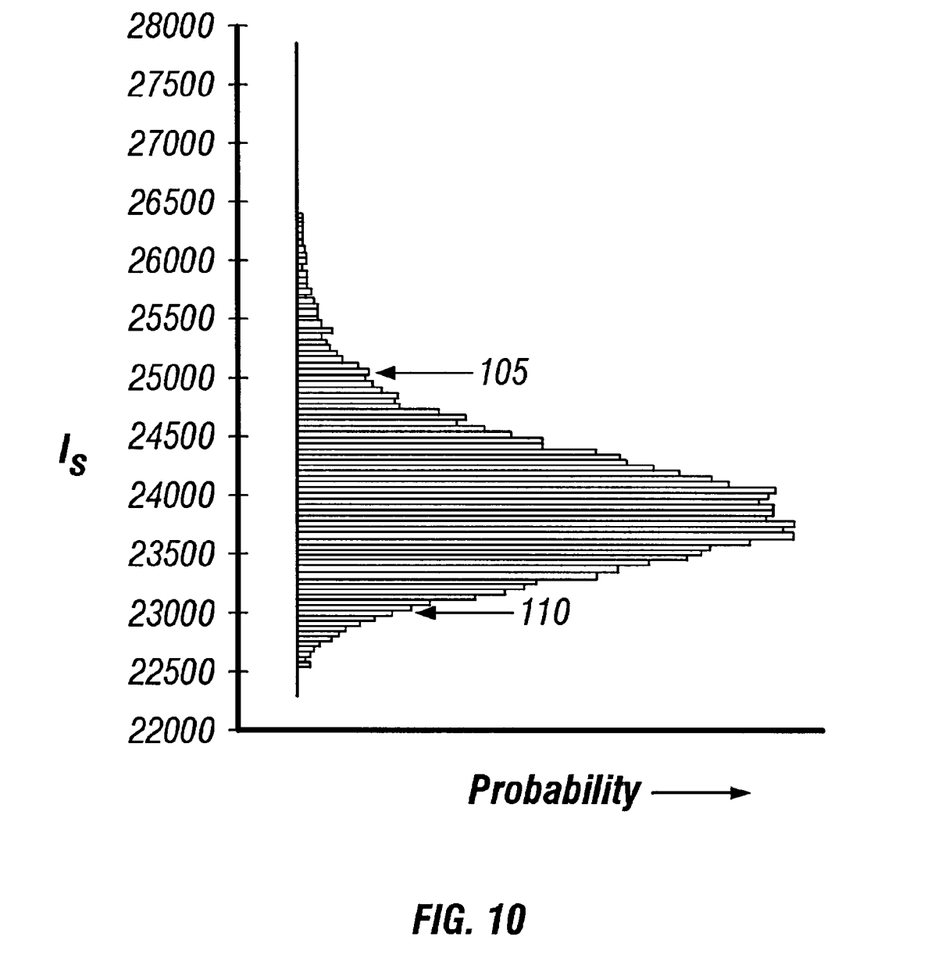
FIG. 10 is a distribution of similarity indices of equation (8) for random wafer sequences, according to an embodiment of the present invention.

The similarity index $I_s$ is compared with a random distribution of similarity indices calculated for wafers in a random processing sequence. An example of a distribution of random indices is given in FIG. 10. Indices $I_s$ that fall in the tails of the distribution, for example at point 105 or at point 110 indicate signficant patterning associated with wafer sequence s. By comparing the index $I_s$ with the distribution in FIG. 10, a process engineer can identify the process step responsible for patterning and take engineering action.

Although the invention has been described with reference to particular embodiments, the description is only an example of the invention's application and should not be taken as a limitation. Various adaptations and combinations of features of the embodiments disclosed are within the scope of the invention as defined by the following claims.

I claim:

1. A method of processing a first number of site-specific data from a plurality of objects in a processor to detect patterns in the data from the objects, the method comprising:
   converting the site-specific data to a set of continuous functions, the set comprising one function for each object in the plurality of objects; and
   computing a second number of distance factor scores and angle factor scores for each object from the set of continuous functions, the distance factor scores being representative of patterns in the data independent of a rotation angle with respect to a fixed position on the objects and the angle factor scores being representative of the rotation angle of patterns in the data, wherein the second number is much smaller than the first number.

2. The method of claim 1 wherein computing a second number of distance factor scores and angle factor scores comprises:
   computing a distance matrix and an angular rotation matrix from the set of continuous functions, an element of the angular rotation matrix, corresponding to a first object and a second object, being an optimal rotation angle that makes the pattern in the data from the first object most similar to the pattern in the data from the second object and an element of the distance matrix, corresponding to the first object and the second object, being a distance between the continuous function of the first object and the continuous function of the second object when rotated at the optimal rotation angle; and
   applying multidimensional scaling to compute the distance factor scores and angle factor scores from the distance matrix and the angular rotation matrix.

3. The method of claim 2 wherein the set of continuous functions further comprises a reflected function for each object, the reflected function for each object being related to the continuous function for each object by reflection in the plane of the object.

4. The method of claim 2 wherein the objects are wafers comprising a plurality of circuits and the site-specific data comprise data corresponding to the sites of the plurality of circuits.

5. A method of detecting processing effects on products manufactured in a manufacturing process comprising:
- ordering a set of products in a first sequence for a first process step in the manufacturing process;
- ordering the set of products in a second sequence for a second process step in the manufacturing process, the second sequence being different from the first sequence;
- extracting site-specific data regarding responses of the products to the process steps in the manufacturing process;
- converting the site-specific data to distance factor scores and angle factor scores for each product, the distance factor scores being representative of patterns in the data independent of a rotation angle with respect to a fixed position on the product and the angle factor scores being representative of the rotation angle of patterns in the data;
- correlating the distance factor scores and angle factor scores with the first processing sequence and the second processing sequence and analyzing the correlated distance factor scores and angle factor scores.

6. The method of claim 5 wherein analyzing the correlated distance factor scores and angle factor scores comprises applying screening methods to identify correlated distance factor scores and angle factor scores that are indicative of processing effects.

7. The method of claim 6 wherein applying screening methods comprises applying run statistics.

8. The method of claim 5 wherein correlating the distance factor scores and angle factor scores with the first processing sequence and the second processing sequence comprises using the distance factor scores and angle factor scores as response variables in wafer position tracking scatter plots.

9. The method of claim 5 wherein ordering a set of products in a first sequence for a first process step in the manufacturing process further comprises systematically rotating the set of products such that each product in the first sequence is rotated more than the preceding product in the first sequence, and
- ordering the set of products in a second sequence for a second process step in the manufacturing process further comprises systematically rotating the set of products such that each product in the second sequence is rotated more than the preceding product in the second sequence.

10. The method of claim 5 wherein converting the site-specific data to distance factor scores and angle factor scores for each product comprises:
- converting the site-specific data to a set of continuous functions, the set comprising one function for each product in the set of products;
- computing a distance matrix and an angular rotation matrix from the set of continuous functions, an element of the angular rotation matrix, corresponding to a first product and a second product, being an optimal rotation angle that makes the pattern in the data from the first product most similar to the pattern in the data from the second product and an element of the distance matrix, corresponding to the first product and the second product, being a distance between the continuous function of the first product and the continuous function of the second product when rotated at the optimal rotation angle; and
- applying multidimensional scaling to compute the distance factor scores and angle factor scores from the distance matrix and the angular rotation matrix.

11. The method of claim 5 wherein the products are wafers comprising circuits.

12. An arrangement for detecting processing effects on products manufactured in a manufacturing process comprising:
- a product handler that arranges the products in a processing sequence;
- a processing apparatus that performs a processing step on the products;
- a detector that detects site-specific response variables of the products;
- a processor that processes the site-specific response variables to determine distance factor scores and angle factor scores for each product, the distance factor scores being representative of patterns in the response variables independent of a rotation angle with respect to a fixed position on the product and the angle factor scores being representative of the rotation angle of patterns in the response variables and correlates the distance factor scores and angle factor scores with the processing sequence.

13. The arrangement of claim 12 wherein the product handler further comprises a product rotator that systematically rotates the products according the processing sequence such that each product in the sequence is rotated more than the preceding product in the sequence.

14. A method of detecting a pattern within products manufactured in a manufacturing process comprising:
- ordering a set of products in a first sequence for a first process step in the manufacturing process;
- systematically rotating the set of products such that each product in the first sequence is rotated more than the preceding product in the first sequence;
- ordering the set of products in a second sequence for a second process step in the manufacturing process, the second sequence being different from the first sequence;
- systematically rotating the set of products such that each product in the second sequence is rotated more than the preceding product in the second sequence;
- extracting site-specific data regarding responses of the products to the process steps in the manufacturing process; and
- displaying the site-specific data for each product, the displays ordered according to the first sequence and according to the second sequence.

15. A method of detecting processing effects on products manufactured in a manufacturing process comprising:
- ordering a set of products in a first sequence for a first process step in the manufacturing process;
- ordering the set of products in a second sequence for a second process step in the manufacturing process, the second sequence being different from the first sequence;
- extracting site-specific data regarding responses of the products to the process steps in the manufacturing process;
- computing a distance matrix from the site-specific data, the element of the distance matrix corresponding to a first product and a second product corresponding to the similarity in pattern of the site-specific data from the first product and the second product;
- computing a first similarity index from the distance matrix and a first wafer-to-wafer distance matrix, the elements of the first wafer-to-wafer distance matrix being the difference in sequence number for the wafers in the first sequence, and computing a second similarity index from the distance matrix and a second wafer-to-wafer distance matrix, the elements of the second wafer-to-wafer distance matrix being the difference in sequence number for the wafers in the second sequence; and comparing the first similarity index and the second similarity index with a distribution of indices for wafers in random sequence to identify processing effects.

16. The method of claim 15 wherein computing the first similarity index comprises:

determining a rank matrix, the elements of the rank matrix corresponding to the rank within the corresponding column of the corresponding element of the distance matrix; and computing the sum of the element-by-element product of the rank matrix and the first wafer-to-wafer distance matrix; and wherein computing the second similarity index comprises:
  computing the sum of the element-by-element product of the rank matrix and the second wafer-to-wafer distance matrix.

* * * * *